Nov. 21, 1961 B. M. VAN EMDEN 3,010,062

CONVERTER CIRCUIT

Filed Jan. 27, 1960

INVENTOR.
BERNARD M. VAN EMDEN

BY Lyon & Lyon

ATTORNEYS.

United States Patent Office 3,010,062 Patented Nov. 21, 1961

3,010,062

CONVERTER CIRCUIT

Bernard M. Van Emden, Van Nuys, Calif., assignor to Crane Co., Burbank, Calif., a corporation of Illinois Filed Jan. 27, 1960, Ser. No. 4,933
9 Claims. (Cl. 321—18)

This invention relates to systems for converting direct current to regulated alternating current and, more particularly, to improvements therein.

An object of this invention is to provide an improved circuit arrangement for converting direct current to alternating current.

Another object of this invention is to provide a converter circuit having high efficiency and high power.

Yet another object of the present invention is to provide a reliable solid-state circuit for converting direct current to voltage-regulated alternating current.

These and other objects of the invention may be achieved by a circuit arrangement wherein the direct current to be converted is applied to two gating amplifiers. An oscillator has its output applied directly to a first of the gating amplifiers and to the second of the gating amplifiers through a controlled phase shifter. The gating amplifiers are enabled to become conductive at the frequency of the oscillations being applied to them. The outputs from the two amplifiers are added and comprise the output from the system. A reference voltage is established and a sample of the combined power-amplifier outputs is compared with the reference voltage. Any difference comprising an error voltage is applied to the control phase shifter to shift the phase of the oscillations applied by it to the second gating amplifier until the error voltage is minimized.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figure 1:
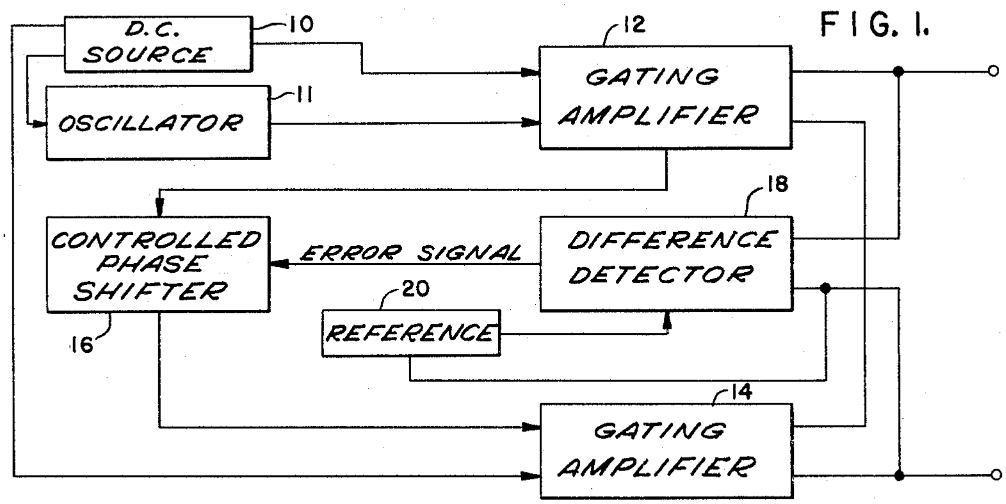
FIGURE 1 is a block diagram of the embodiment of the invention.

Reference is now made to FIGURE 1, which is a block diagram of the embodiment of the invention. The direct-current power source 10, output from which is to be converted into alternating current, is applied to an oscillator 11, a first gating amplifier 12, and a second gating amplifier 14. The oscillator provides a gating-signal output for the gating amplifiers at any suitable frequency. In the embodiment of the invention, this was established at 400 cycles per second. The output of the oscillator 11 is applied to the power amplifier 12, to effectively be amplified. A portion of the gating amplifier 14 output is applied to a controllable phase shifter 16. The controllable phase shifter output is the same as its input, except it may be shifted in phase in response to an error voltage, as will be subsequently described herein.

The output of the controllable phase shifter 16 is applied to the second gating amplifier 14 to be amplified. The outputs from both amplifiers are added and constitute the output from the circuit. A sample of the combined output is applied to a difference-detector circuit 18. The difference-detector circuit 18 compares the sample of the output voltage with a reference voltage established by a reference circuit 20. Any difference, which constitutes an error signal, is applied to the controllable phase shifter 16, to shift the phase of the output in a direction to minimize the difference.

If $E_1$ represents the output voltage from the first power amplifier and $E_2$ represents the output voltage from the second power amplifier, then $$\vec{E}_0 = \vec{E}_1 + \vec{E}_2$$

An equation which represents $E_0$ as a function of time is as follows:

$$E_0(t) = E_1^2 + E_2^2 - 2E_1E_2 \cos \phi$$

Here the symbol $\phi$ represents the angle between output voltages $E_1$ and $E_2$, which is determined by the control phase shifter in response to the difference detector 18. Thus, the amplitude of $E_0$ can be controlled by varying the relative phase or angle between the voltages applied to the inputs to the two gating amplifiers.

Figure 2:
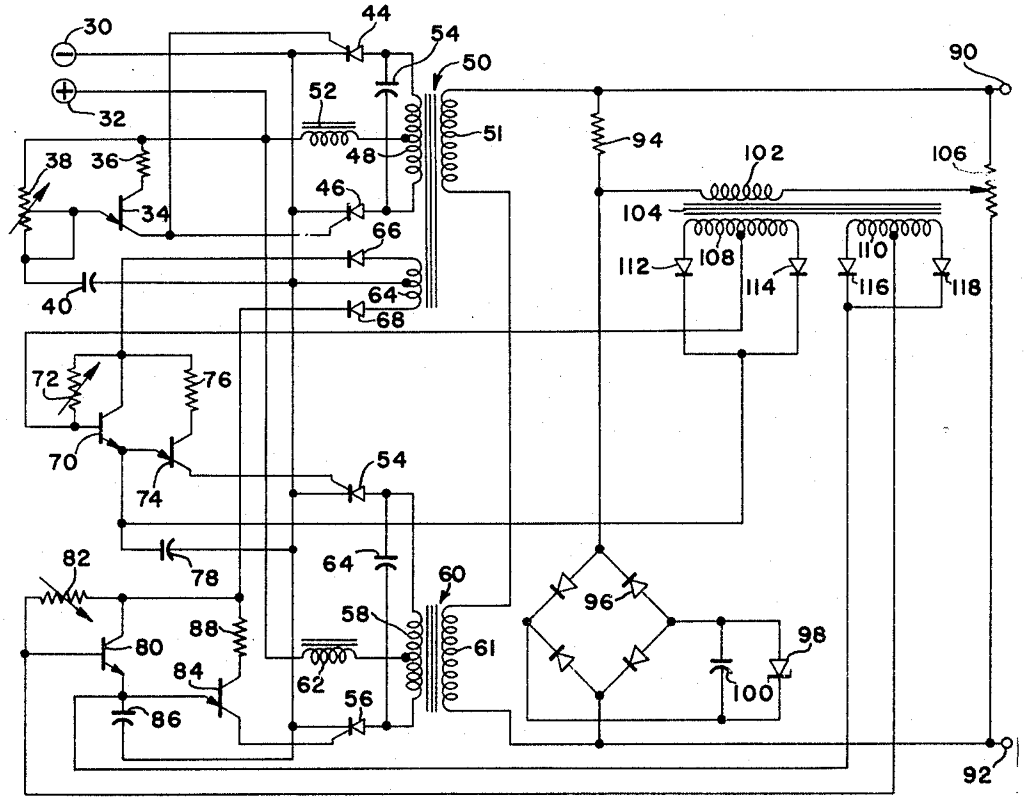
FIGURE 2 is a circuit diagram of the embodiment of the invention.

FIGURE 2 shows a circuit diagram of an embodiment of the invention which operates in accordance with the description provided in FIGURE 1. Direct current to be converted is applied to the input terminals 30, 32, with the polarity as shown. The oscillator circuit 11 comprises a unijunction transistor 34 connected in a typical oscillator-circuit arrangement and receiving direct current from the terminals 30, 32. The terminal 32 is connected to one base electrode of the unijunction transistor 34 through a resistor 36. The terminal 32 is connected through a potentiometer 38, to the emitter electrode of the unijunction transistor. The potentiometer 38 is also connected through a capacitor 40 to the other terminal 30. Output from the unijunction transistor 34 is derived from its second base electrode and is applied to the control electrodes of two silicon control rectifiers, respectively 44, 46. These silicon control rectifiers are both connected between the terminal 32 and the outer ends of a center-tapped primary winding 48 of a transformer 50. The return connection of the silicon control diodes to the terminal 30 is made from the center of winding 48 through a current-surge-limiting inductance 52 to the terminal 30. A capacitance 54 is connected across the primary winding 48.

The frequency of oscillation of the circuit including the unijunction transistor 34 is determined by the setting of the potentiometer 38. This determines the time required for the capacitor 40 to charge up to a value at which current can flow through the unijunction transistor 34. As soon as current flows through the unijunction transistor, the capacitor 40 begins to discharge, thereby dropping the control voltage below the value necessary for enabling current flow through the unijunction transistor 34. The capacitor then commences to charge up again, thus initiating a new cycle of oscillation.

Initially, upon the application of operating potentials, one of the silicon control rectifiers will begin to conduct in preference to the other, which will be prevented from conducting by the voltage momentarily applied through the capacitor 54. The output from the oscillator circuit is applied to both control electrodes of the silicon control rectifier. However, only the one which is not conducting can respond to the first output cycle, since the other rectifier is already conducting. The turn-on of the non-conducting silicon control rectifier causes a pulse to be applied through the capacitor 54 to the other rectifier, causing it to become nonconducting, or turn off. This condition prevails until the next pulse is received from the oscillator, at which time conduction between the two silicon control rectifiers is interchanged. As a result, the output from the direct current voltage source 10 is converted to an alternating current at the frequency of the oscillator. This alternating current is applied to the transformer 50, wherein the voltage is increased.

The second power amplifier comprises another pair of silicon control rectifiers 54, 56, which have one of their electrodes connected to the terminal 30 and their opposite electrodes connected to opposite ends of the center-tapped primary winding 58 of a transformer 60. A current-surge-limiting inductance 62 connects the center of the winding 58 to the terminal 32, and a capacitor 64 is connected across the winding 58. It will therefore be noted that the gating amplifiers are identical in construction and operate similarly.

Oscillations for application to the control electrodes of the silicon control rectifiers 54, 56 of the second power amplifier are derived by means of a center-tapped winding 64, which is wound on the core of transformer 50. The center tap of the winding 64 is connected to the terminal 30. One end of the winding 64 is connected through a rectifier or diode 66 to a first time-delay circuit. The other end of the winding 64 is connected through a diode 68 to a second time-delay circuit. The first time-delay circuit includes an npn transistor 70 which derives its collector potential from the diode 66. A potentiometer 72 is connected between its collector and base. Its emitter is connected to the emitter electrode of a unijunction transistor 74. One base electrode of the unijunction transistor 74 is connected to the diode 66 through a resistor 76. The other base electrode of the unijunction transistor 74 is connected to the control electrode of the silicon control rectifier 54. The emitter of the transistor 70, as well as the emitter electrode of the unijunction transistor 74, are both also connected to a capacitor 78, which is connected to terminal 32.

The second time-delay circuit has essentially the same structure. It comprises an npn transistor 80 which has its collector connected to the diode 68. A potentiometer 82 connects the collector to the base of the transistor 80. The emitter of the transistor 80 is connected to the emitter control electrode of a unijunction transistor 84, and is also connected to a capacitor 86, which is connected to the terminal 30. The unijunction transistor 84 has one base electrode connected through a resistor 88 to the diode 68, and the other base electrode is connected to the silicon control rectifier 56 to control current flow therethrough.

A description of the operation of one of the time-delay circuits illustrates the operation of both. Therefore, only one will be described. The unijunction transistor requires a minimum voltage to be applied to its emitter or control electrode to enable current flow therethrough. The amplitude of this voltage is determined by the transistor 70, which effectively is in series with the capacitor 78. When a voltage, applied to the base of the transistor 70, enables current flow therethrough, capacitor 78 is enabled to charge up. When the capacitor charges up to the value required to enable the unijunction transistor 74 to become conductive, then the silicon control rectifiers 54, 56 can interchange conduction in the manner previously described. Thus, the control of the transistors 70 and 80 can determine at what time the silicon control rectifiers will interchange conduction, and for how long. This type of control for both silicon control rectifiers 54, 56 effectively determines the phase of the output derived from transformer 60 with respect to the phase of the output derived from transformer 50.

The secondary windings, respectively 51 and 61 of transformers 50 and 60, are connected in series to provide a combination or vectorial addition of the outputs of the two power amplifiers. The outputs of the two secondary windings 51 and 61 are connected to output terminals 90, 92. A desired output voltage reference standard is established by connecting across the output terminals 90, 92 a resistor 94 in series with a diode bridge 96. The voltage at the junction between the diode bridge 96 and the resistor 94 is maintained constant by the expedient of a Zener diode 98 and a capacitor 100, which are connected across the opposite two diagonals of the bridge 96 to the two which are connected in series with the resistor 94. The effect of the bridge and Zener diode circuit is to maintain current flow through resistor 94 substantially constant, whereby the voltage at its junction with the bridge is maintained constant.

Voltage at the junction of the resistor 94 with the bridge 96 is applied to one end of the primary winding 102 of a transformer 104. The other end of the primary winding 102 is connected to the slider of a variable potentiometer 106. This potentiometer is connected across the output terminals 90, 92, and its slider may be said to derive a sample of the output voltage. As a result of this connection the primary winding 102 will have across it a voltage consisting of the difference between the reference voltage and the sample voltage. The transformer 104 has two secondary windings, respectively 108 and 110. As a result of a voltage difference across winding 102, a voltage corresponding thereto will be induced in the respective windings 108, 110.

Winding 108 has a center tap which is connected to the base of transistor 70. Both ends of winding 108 are connected to diodes, respectively 112, 114, and from there to the emitter electrode of the unijunction transistor 74. Winding 110 is also center tapped and has its center tap connected to the base of the transistor 80. The opposite ends of winding 110 are connected to diodes, respectively 116, 118, to the emitter electrode of the unijunction transistor 84.

The times when transistors 70, 80 can conduct are determined by the output derived from the transformer 50 and therefore by the oscillator circuit. The extent of such conduction is determined by the error signal. Therefore, the time when each of the silicon control rectifiers 54, 56 can become conductive is determined by the error signal. If the output voltage from the power amplifier exceeds the reference level, then the difference voltage which is seen across windings 108 and 110 reduces current flow through transistors 70, 80, causing a longer interval of time to be employed for charging the respective capacitors 78, 86 up to the level required to initiate current flow through the unijunction transistors. This delays interchange of silicon control rectifier current conditions. Should the reference voltage exceed the output voltage sample, this increases the signal applied to the bases of the respective transistors 70, 80, thereby increasing the current flow through these transistors and charging the capacitors 78 and 86 more rapidly. As a result, the silicon control rectifiers 54, 56 have their current condition interchanges initiated at an earlier time.

There has accordingly been described and shown herein a novel, useful, solid-state converter and voltage-regulator circuit. The level of the output is maintained at a value determined by the level of the reference. Of course, if the regulated direct current is desired, this apparatus may be employed using rectifiers at the output terminals.

I claim:

1. A converter circuit for converting direct current from a source of direct current to alternating current comprising a first normally closed gating amplifier, a second normally closed gating amplifier, means for applying direct current from said source to said first and second gating amplifiers, an oscillator means for applying output from said oscillator to said first gating amplifier to open said first gating amplifier responsive thereto to pass current from said source, a controllable phase-shift circuit, means for applying a portion of the output from said first gating amplifier to said controllable phase-shift circuit, means for applying output from said controllable phase-shift circuit to said second gating amplifier to open said second gating amplifier responsive thereto to current from said source, means for combining the outputs of said first and second gating amplifiers, means for establishing a reference voltage, means for comparing the combined outputs of said first and second amplifiers with said reference voltage to provide a signal representative of any difference, and means for applying said signal representative of any difference to said controllable phase-shift circuit to control the delay in the output of said phase-shift circuit relative to its input to minimize said signal.

2. A converter circuit as recited in claim 1 wherein each of said first and second normally closed gating amplifier circuits comprises a first and second silicon control rectifier, each having a gating electrode, a transformer having a center-tapped primary winding and a secondary winding, means connecting each said silicon control rectifier respectively to the opposite ends of said transformer primary winding, a capacitor connected between the ends of said transformer primary winding, and an inductance having one end connected to the center tap of said primary winding for blocking current surges, means connecting the gating electrodes of said first and second silicon control rectifiers in said first gating amplifier to said oscillator, means connecting the gating electrodes of said first and second silicon control rectifiers in said second gating amplifier to said controllable phase-shift circuit, and means connecting the other ends of both said inductances to said source of direct current.

3. A converter circuit as recited in claim 1 wherein said controllable phase-shift circuit includes a transistor, a capacitor, means connecting said capacitor to said transistor to be charged in response to current flow through said transistor, means for applying output from said first gating amplifier to said transistor as operating potential, means for applying said signal representative of any difference to said transistor for controlling current flow therethrough, a unijunction transistor, means for applying said portion of the output from said first gating amplifier thereacross, means for connecting said capacitor to said unijunction transistor to control current flow therethrough responsive to the charge on said capacitor, and means to apply the output of said unijunction transistor to control the gating of said second gating amplifier.

4. A converter circuit as recited in claim 1 wherein said oscillator comprises a unijunction transistor, a resistor, a capacitor connected in series with said resistor, means for applying potential from said direct current source across said resistor and capacitor to charge up said capacitor, and means for connecting said capacitor to said unijunction transistor to control its conduction responsive to the charge on said capacitor.

5. A converter circuit for converting direct current from a source of direct current to alternating current comprising a first and second gating amplifier each including a first and second rectifier, a transformer having a center-tapped primary and a secondary winding, means connecting said first and second rectifiers to the opposite ends of said primary winding, and means for connecting said source of direct current to said first and second rectifiers and to said primary winding center tap, oscillator means for rendering the first and second rectifier means of said first gating amplifier alternately conductive, controllable delay means for rendering the first and second rectifier means of said second gating amplifier alternately conductive, means for exciting said controllable delay means from the transformer of said first amplifier, means for connecting the secondary windings of the transformers of said first and second gating amplifiers in series to provide a resultant output voltage, means for establishing a reference voltage, means for comparing said reference voltage with said resultant output voltage to obtain a difference signal, and means for applying said difference signal to said controllable delay means for controlling the rendering conductive of the first and second rectifier means of said second amplifier to minimize said difference signal.

6. A converter circuit as recited in claim 5 wherein said means for comparing said reference voltage with said resultant output voltage comprises a transformer having a primary and two secondary windings, means for applying said reference voltage and said resultant output voltage respectively to opposite ends of said primary winding, and means to apply the outputs of said two secondary windings to said controllable delay means.

7. A converter as recited in claim 5 wherein said controllable delay means includes for each rectifier in said second gated amplifier circuit a transistor, means for applying output from one of said two secondary windings to control current flow therethrough, a capacitor connected to said transistor to be charged by current flowing therethrough, a unijunction transistor, means for connecting said capacitor to said unijunction transistor to render it conductive responsive to the charge on said capacitor, and means for connecting the respective unijunction transistors to the respective first and second rectifier means of said second amplifier to render them alternately conductive responsive to the conductive conditions of said unijunction transistors.

8. A converter as recited in claim 6 wherein all of the rectifiers are silicon control rectifiers, and a capacitor is connected across the primary winding of each transformer in said first and second gated amplifiers.

9. A converter as recited in claim 8 wherein said means for exciting said controllable delay means from the transformer of said first gated amplifier comprises an additional winding on said transformer.

No references cited.